(12) United States Patent
Harris et al.

(10) Patent No.: US 6,670,705 B1
(45) Date of Patent: Dec. 30, 2003

(54) PROTECTIVE LAYER FOR A SEMICONDUCTOR DEVICE

(75) Inventors: Christopher Harris, Sollentuna (SE); Mietek Bakowski, Södertälje (SE); Jan Szmidt, Warszawa (PL)

(73) Assignee: Acreo AB, Kista (SE)

( * ) Notice: Subject to any disclaimer, the term of this patent is extended or adjusted under 35 U.S.C. 154(b) by 0 days.

(21) Appl. No.: 10/070,968

(22) PCT Filed: Mar. 15, 2000

(86) PCT No.: PCT/SE00/00505

§ 371 (c)(1),
(2), (4) Date: Jun. 25, 2002

(87) PCT Pub. No.: WO01/20672

PCT Pub. Date: Mar. 22, 2001

(30) Foreign Application Priority Data

Sep. 13, 1999 (SE) ................................ 9903242

(51) Int. Cl.⁷ .................... H01L 23/14; H01L 23/06; H01L 23/10; H01L 23/15; H01L 23/12
(52) U.S. Cl. ................... 257/702; 257/703; 257/705
(58) Field of Search ................... 438/124, 125; 257/702, 703, 705

(56) References Cited

U.S. PATENT DOCUMENTS

| | | | |
|---|---|---|---|
| 4,968,644 A | * 11/1990 | Gallagher et al. | 438/680 |
| 5,036,373 A | 7/1991 | Yamazaki | |
| 5,354,717 A | * 10/1994 | Pollock et al. | 438/125 |
| 5,766,979 A | * 6/1998 | Budnaitis | 514/565 |

FOREIGN PATENT DOCUMENTS

WO 96/21246 7/1996

OTHER PUBLICATIONS

Choi, W.B. et al., "Field Emission from Wide Band Gap Materials", Plasma Science 1998, 25th Anniversary IEEE Conference Record–Abstract, 1998 IEEE International on p. 214, North Carolina State University, Raleigh, North Carolina, Jun. 1–4, 1998.

* cited by examiner

Primary Examiner—Olik Chaudhuri
Assistant Examiner—William M. Brewster
(74) Attorney, Agent, or Firm—Dilworth & Barrese, LLP.

(57) ABSTRACT

A semiconductor device comprises at least one first semiconductor layer (1–4) and a second layer (8) applied on at least a surface portion of the first layer for protecting the device. The protecting layer is of a second material having a larger energy gap between the valence band and the conduction band than a first material forming said first layer. The second material has at least in one portion of said protecting layer a nano-crystalline and amorphous structure by being composed of crystalline gains with a size less than 100 nm and a resistivity at room temperature exceeding $1 \times 10^{10}$ Ωcm.

34 Claims, 2 Drawing Sheets

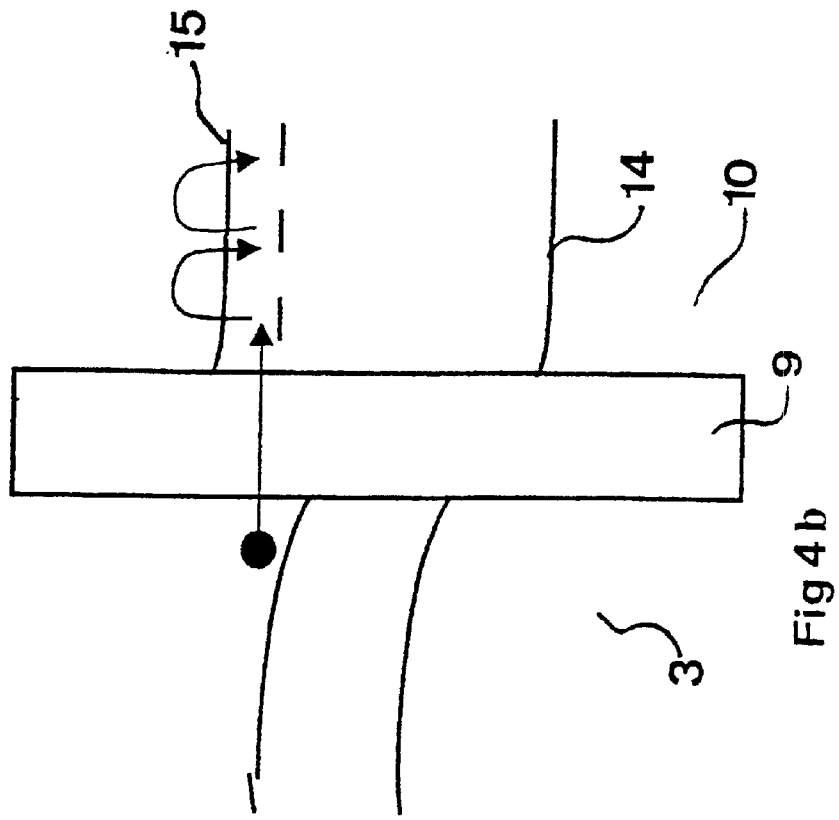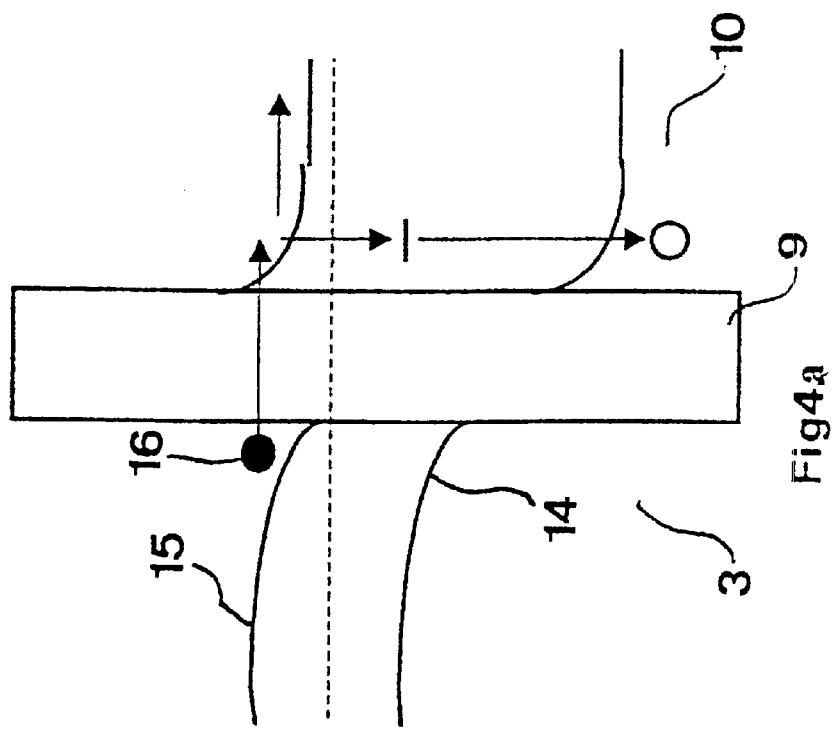

PROTECTIVE LAYER FOR A SEMICONDUCTOR DEVICE

The present invention relates to a semiconductor device comprising at least one first semiconductor layer and a second layer applied on at least a surface portion of the first layer for protecting the device, said protecting layer being of a second material having a larger energy gap between the valence band and conduction band than a first material forming said first layer.

All types of semiconductor devices are comprised, such as for example different types of diodes, transistors and thyristors. "Semiconductor device" is here to be interpretated very broadly and covers not only what is usually meant by this expression, but also integrated circuits and Multi Chip Module (MCM). Furthermore, "protecting" includes different type of protection, such as against high electric fields, moisture, mechanical damage, chemical reactions and so on, so that this word includes "insulating", "passivating" and "protecting" as commonly used.

Accordingly, the present invention is neither restricted to passivation of a semiconductor device nor to any typical operation temperature of such a device, but the invention will hereinafter be particularly thoroughly discussed with respect to problems arising when passivating a semiconductor device adapted to operate at high temperatures for illuminating but not in any way limiting the present invention.

The passivation of the semiconductor device is made for different reasons and using different means and it is crucial for a reliable device operation. It may consist of one or several layers of the same or different insulator materials. The primary function of the passivation is to stabilise and to improve electronic or photo-electronic device performance characteristics. Another is to serve as passive coating protecting and isolating the device from the ambient environment, especially to prevent moisture and ion migration which may damage the semiconductor layer. For achieving this several demands are put simultaneously on a good passivation material: it should stabilise the surface region of the device often together with other measures applied to the semiconductor surface region itself. The other measures relate to different techniques used to control and reduce the electric field and leakage current by means of controlling the doping in the semiconductor surface region and sometimes also structural and chemical properties of the semiconductor surface or its topography. It should contribute in smoothing out and reducing the electric field created in the surface region of the device during its operation. It should prevent moisture and ionic species reaching the surface by presenting an efficient diffusion barrier. The chemical bonding between said second layer next to the semiconductor layer and the semiconductor layer should not introduce interfacial charge of its own and the insulator should be free from mobile charges and polarisation effects. If possible, the passivation should shield the device from electrical fields and charges created by electrostatic discharge in the surrounding ambient. The passivating layer should also provide mechanical protection of the device surface.

In order to do all this the material of the passivation layer should have a high resistivity and a high breakdown strength as well as a low density of shallow and deep level interfacial and bulk traps. Shallow centra act as doping levels and may reduce the resistivity of the layer and deep centers may give rise to quasi-permanent charging of the passivation layer.

The demands set on a protecting, passivating or insulating layer are especially severe in semiconductor devices intended for high temperature operation. Such a layer should have good adhesion to the substrate (semiconductor layer) and be structurally compatible with the substrate. The properties of the passivating layer should be: as little as possible dependent on the temperature in the operational temperature range. The layer should especially preserve high resistivity and high breakdown strength at high temperatures. Closely matched thermal expansion coefficients of the material of the semiconductor layer and that of the passivating layer are required to prevent build-up of stresses in the semiconductor. The protecting layer may also otherwise "let the grip" to the semiconductor layer go when the temperature changes and be at least partially released from the latter. The passivating layer should also be mechanically, thermally and chemically stable in the entire operational range of the device. Furthermore, the passivating layer should have a good thermal conduction. If such a passivating layer is also highly resistant to the environmental influence it could open possibilities of greatly simplifying the encapsulation issues by relieving the demands for hermetic packaging.

It would also be preferred that such a passivating layer may be produced at low process temperatures while allowing only low energy of particles, such as ions, photons or electrons, to hit the semiconductor layer during the deposition process.

Moreover, the present invention is directed to semiconductor devices of all types of semiconductor material as said first material, but it is particularly directed to obtaining a passivation adapted to SiC as such semiconductor material, so that especially the properties of SiC to withstand high temperatures and high breakdown fields may be utilised. For passivating semiconductor devices of SiC it is known to use thermal silicon dioxide in combination with a layer of silicon nitride or in combination with a thick layer of silicon dioxide created by CVD (Chemical Vapour Deposition). However, silicon dioxide is not a satisfactory passivation material for silicon carbide, especially not at high temperatures. This is due to two reasons. One is the relatively low ratio between breakdown field of silicon dioxide and silicon carbide which in combination with the relation between the dielectric constants of both materials, brings the electric field in silicon dioxide to only about a factor two lower than the critical breakdown field of the best quality silicon dioxides when the field in silicon carbide is close to its maximum value. The second is a relatively small energy barrier between the silicon carbide and the silicon dioxide, which increases the probability of charge injection. Both factors combine and lead to drastically reduce dielectric strength and reliability of the silicon dioxide at elevated temperatures. Furthermore, silicon dioxide grown on SiC is contaminated by unremoved carbon and it's structure is also probably disturbed by the volatile carbon compounds leaving the oxide during it's formation, like CO and $CO_2$.

Other materials than silicon dioxide, such as substantially monocrystalline AlN (PCT/SE95/01596), having a substantially monocrystalline structure have also been proposed for passivating SiC-devices. These materials have, however, a risk of build-up of stresses should the lattice match at the interface not be nearly perfect.

SUMMARY OF THE INVENTION

The object of the present invention is to provide a semiconductor device of the type defined in the introduction, in which said protecting layer fulfils its function in a better way than such layers already known while to a large extent satisfying the demands put on such a layer mentioned above.

This object is according to the invention obtained by providing such a semiconductor device in which said second material has at least in one portion of said protecting layer a nano-crystalline and amorphous structure by being composed of crystalline grains with a size less than 100 nm and a resistivity at room-temperature exceeding $1 \times 10^{10}$ Ωcm.

Said nano-crystalline and amorphous structure of the second material will facilitate structural adjustment of the protecting layer to said first semiconductor layer preventing occurrence of mechanical stresses being the cause of poor adhesion, of occurrence of high concentration of electronic interface states leading in turn to charging phenomena and instabilities and of reduced resistance to mechanical and thermal stresses leading to for instance micro-cracks. In addition, the nano-crystalline and amorphous structure reduces the influence of grain boundaries, that constitute serious structural defects in the crystalline structures, on the properties of the layers. Another advantage of said nano-crystalline and amorphous structure is that it may be obtained by much lower process temperatures than monocrystalline structures, such as for example Reactive Pulse Plasma method (RPP) at 25° C. or Radio Frequency Plasma method (RFP) below 500° C. Both plasma methods can also be combined in the same growth and deposition process. Important characteristics of the process are the specific process conditions as well as in situ substrate preparation procedures for pre-cleaning and pre-etching all necessary to obtain the best desired effect.

It is another object of the present invention to provide a semiconductor device defined in the introduction with a protecting layer that is thermally stable at different temperatures, especially at high temperatures, such as at the possible operation temperature of SiC (up to 900° C.) and can withstand breakdown fields close to the physical limit of SiC (1–2 MV/cm).

This object is according to the invention obtained by providing such a device in which said second material has at least in one portion of said protecting layer a nano-crystalline and/or amorphous structure, whereas nano-crystalline structure is defined as composed of crystalline grains with a size less than 100 nm, and said second material is one or a combination of any member of the following group of compounds: AlN, GaN, CN, BN and NCD (Nano-Crystalline Diamond).

Such a second material for the protecting layer means a good adhesion to the SiC surface at high temperatures, good mechanical properties and good dielectric properties. It may also be created by said deposition techniques (RPP and RFP) at a low temperature regime. Accordingly, structural adjustment of the second material to the semiconductor material is facilitated by the amorphous and/or nano-crystalline structure preventing occurrence of mechanical stresses between the two layers being the cause of a lot of problems mentioned above.

According to a preferred embodiment of the invention said first material is adapted to enable an operation temperature of the semiconductor device of at least 200° C. by being electrically stable at that temperature. Especially the nano-crystalline and/or amorphous structure property of said second material makes it well suited for such high temperature operation applications, since it will counteract problems of poor adhesion at higher temperatures due to slightly different coefficients of thermal expansion between the semiconductor material and said second material.

According to another preferred embodiment of the invention said first material is SiC. The invention is particularly suited for semiconductor devices having SiC as semiconductor material, since the properties of the material for said second layer are particularly advantageous for applications, in which the properties of SiC to withstand high temperatures and high electric fields may be utilised.

According to another preferred embodiment of the invention said protecting layer comprise at least two sub-layers, namely a thin poly- or monocrystalline first sub-layer forming an interface to said first semiconductor layer and a much thicker nano crystalline and/or amorphous second sub-layer on top thereof. "Thin" does here preferably mean a thickness of a few atom layers. Such a thin layer with higher crystalline quality than the rest of the protecting layer may be of interest when a very good lattice match may be obtained between the semiconductor material and material used for said thin sub-layer and it may for such a material be automatically created even if a deposition technique with a low process temperature giving rise to a nano-crystalline or amorphous structure in the bulk of the protecting layer is used.

Such a thin layer with higher crystalline quality (or crystalline) may be SiC, AlN, CN, BN or diamond.

According to another preferred embodiment of the invention said protecting layer comprise at least two sub-layers, namely a thin amorphous first sub-layer forming an interface to said first semiconductor layer and a much thicker nano-crystalline and/or amorphous second sub-layer on top thereof. "Thin" does here preferably mean a thickness of a few atom layers.

Such a thin amorphous layer have a structural composition that can be described as consisting of following compounds or a combination thereof $SiO_2$, SiO, SiON, SiN being in the most simple cases a silicon dioxide or silicon oxynitride or silicon nitride.

According to another preferred embodiment of the invention said protecting layer comprise at least two sub-layers, namely a thin monocrystalline or amorphous first sub-layer forming an interface to said first semiconductor layer and a much thicker nano crystalline and/or amorphous second sub-layer on top thereof. "Thin" does here preferably mean a thickness of one to 15 nm. Such a thin layer with higher bandgap than that of SiC will constitute a tunneling barrier for charge carriers between the SiC and the second sub-layer. The function of the first sub-layer is to provide a good and stable interface to the SiC characterised by low density of the interface states. While the function of the second sub-layer is to transport away or neutralise the charge carriers tunneling. through the barrier. Due to the fact that charge is tunneling through the first sub-layer it is not interacting with it in a way it would if the layer would be thick and the transport through it would occur by conduction. This means that there is no charge trapping in the first sub-layer and that the charge state of the passivation is controlled mainly by the second sub-layer.

Such a thin first sub-layer could be $SiO_2$, SiC, AlN, BN, CN or (C) diamond, or metal oxide like for example $Al_2O_3$, $Ta_2O_5$, TiO, $TiO_2$, MgO.

According to a preferred embodiment of the invention the main part of the protecting layer has a nano-crystalline and/or amorphous structure. Accordingly, substantially the entire protecting layer is purely amorphous, purely nano-crystalline or a combination thereof, which makes it well suited for use as encapsulation of the entire device, especially Multi Chip Modules and integrated circuits. Accordingly, such a protecting layer may effectively shield active parts of such devices and electronic circuits from the environment, which is of particular interest in the case of devices intended for high temperature operation and in combination with hostile environments that are destructive to both semiconductor devices and metallisation interconnections.

According to another preferred embodiment of the invention said device has a junction adapted to hold a voltage in a blocking state of the device and said protecting layer is adapted to passivate said junction, which may be a pn-junction, but also a Schottky-junction. This is particularly advantageous in combination with the group of compounds mentioned above, since the electric fields created in those materials will be remarkably lower than their critical electric field also when used in combination with SiC withstanding very high fields. The low density of interface states will contribute to the possibility to efficiently passivate such a junction for high electric fields.

Further advantages and advantageous features of the invention appear from the following description and the other dependent claims.

BRIEF DESCRIPTION OF THE DRAWINGS

With reference to the appended drawings, below follows a specific description of a preferred embodiment of the invention cited as an example.

In the drawings:

FIG. 4a and FIG. 4b are schematic graphs of the extension of the valence band and the conduction band from the first layer through a thin first sub-layer to a second sub-layer in a device of the present invention.

DETAILED DESCRIPTION OF A PREFERRED EMBODIMENT OF THE INVENTION

Figure 1:
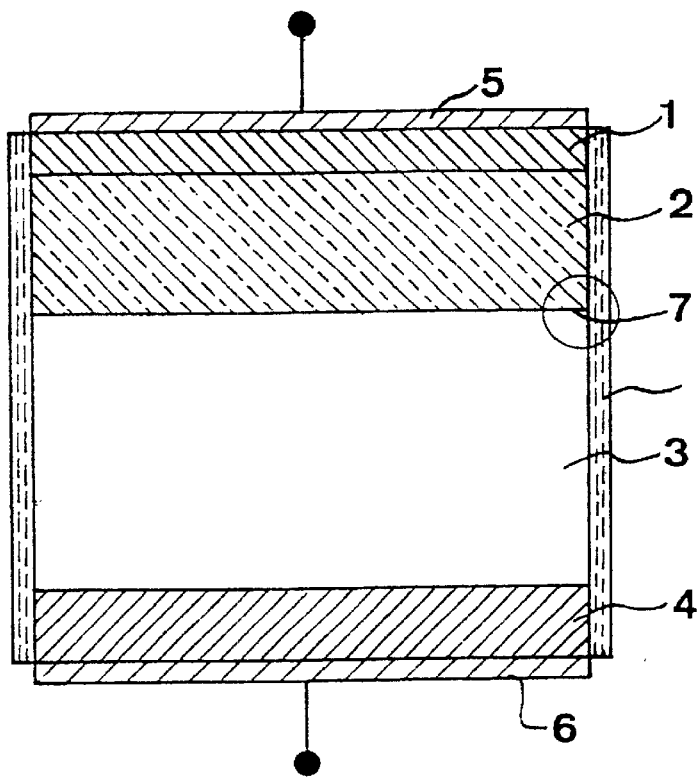
FIG. 1 is a very schematic cross-section view of a semiconductor device of the present invention.

FIG. 1 illustrates by way of a non-limititive example of a device to which the invention may be applied, a semiconductor diode with four semiconductor layers of SiC, namely a first very highly doped layer 1 of P-type, a second highly doped layer 2 of P-type, a third lightly doped layer 3 of N-type and a fourth highly doped layer 4 of N-type. The four layers are superimposed in the order mentioned. The device does also have an ohmic metal contact 5 arranged on the top of the layer first mentioned and forming the anode of the diode and a second ohmic metal contact 6 arranged in contact with the layer 4 and forming the cathode of the diode. The layers 1 and 4 are used for making good contacts to the metal contacts 5 and 6, respectively. The diode is encapsulated and the pn-junction 7 between the two layers 2 and 3 is passivated by a protecting layer 8 covering the entire device with exception for the two contacts 5 and 6. The device may be produced by known growing and etching techniques. In a conventional way, the device will be conducting when a positive voltage is applied to the metal contact 5 in contact with the layer of P-type and blocking when a negative voltage is applied to that contact with respective to the potential of the second contact 6. In the blocking state of the device the electric field will be concentrated to the PN-junction 7, and the requirements of the passivation will be highest in that region for making it possible for the device to withstand as high voltage as possible without any breakdown.

The semiconductor layers 1–4 of, the device are here made of SiC. The protecting layer 8 is deposited on the peripheral surfaces of the SiC layers by using plasma assisted chemical deposition techniques with low processing temperatures, such as Reactive Pulse Plasma method (RPP) (25° C.) or Radio Frequency Plasma method (RFP) (<500° C.) using non-toxic material sources. An amorphous or nano-crystalline layer 8 of a material being one or a combination of any member of the following group of compounds is formed in this way: AlN, GaN, CN, BN, NCD (Nano-Crystalline Diamond) or metal oxides like for example $Al_2O_3$, $Ta_2O_5$, TiO, $TiO_2$, MgO. It is then necessary that the members of this group is selected so that the energy gap between the valence band and the conduction band thereof will be substantially larger than that of the semiconductor material, in this case SiC. It is of highest importance to point out that the plasma deposition method allows for a wide choice of deposition parameters as well as the in situ substrate preparation through cleaning and etching in order to secure the best possible interface between the passivating layer and the substrate characterised by good adhesion and good electronic properties. This is especially important in the case of two element substrates like SiC and GaAs on which it is known to be difficult to grow a dielectric layer with good dielectric and chemical properties.

Figure 2:
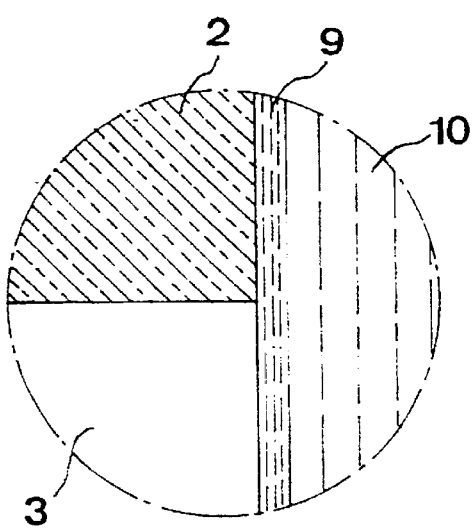
FIG. 2 is an enlarged view of a portion of the device shown in FIG. 1 at the surface of a pn-junction thereof.

It is illustrated in FIG. 2 how the protecting layer 8 may be composed of two sub-layers, namely a first very thin layer 9 forming an interface to the semiconductor layer and having a thickness of only a few atom layers and a much thicker second sub-layer 10 on top thereof, which will take care of the protecting task of the layer 8 and may have a thickness of several $\mu$m. The sub-layer 9 will be automatically formed when depositing a material having an ability to forming a lattice with a very good match to SiC when using the low process temperature deposition techniques mentioned above, such as AlN, which has a 2H structure in monocrystalline form and will match under given orientation with all types of SiC polytypes, both cubic and hexagonal ones, and it has a good lattice-match with a misfit of only 0,7%. However, more far away from the interface a nano- or nearly amorphous structure will be created, whereas nano-crystalline is defined as composed of crystalline grains with a size less than 100 nm. Furthermore, the resistivity of the material of the protecting layer 8 at room temperature will exceed $1 \times 10^{10}$ $\Omega$cm. The amorphous and/or nano-crystalline structure of the main part of the protecting layer 8 leads to advantages compared to crystalline or poly-crystalline material. It facilitates a structural adjustment of the protecting layer 8 to the semiconductor layer preventing occurrence of mechanical stresses being the cause of poor adhesion, of occurrence of high concentration of electronic interface states leading in turn to charging phenomena and instabilities and of reduced resistance to mechanical and thermal stresses leading to for instance micro-cracks. In addition, the nano-crystalline and/or amorphous structure reduces the concentration of serious structural defects present in the crystalline structures constituted of grain boundaries. These features make the protecting layer 8 suitable for use of the semiconductor device where extreme conditions prevail, such as in high temperature environments or when the power losses of the device are that high that the device itself produces high temperatures, such as at high switching frequencies or when high powers are handled, and at high voltages in the blocking state of the device.

Figure 3:
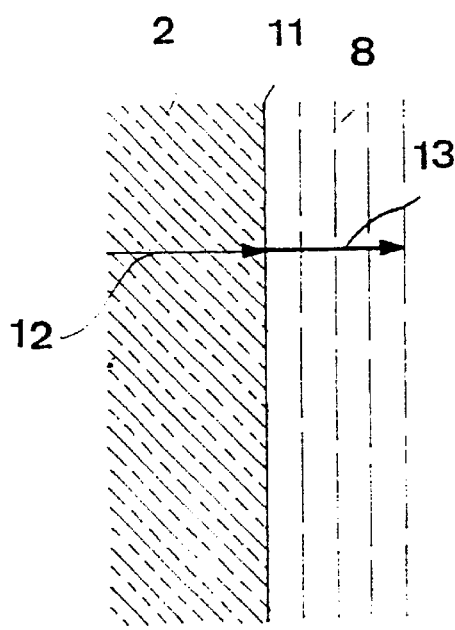
FIG. 3 is a schematic view of the interface between a semiconductor layer and a protecting layer of a device of the type shown in FIG. 1 illustrating how the electric field may change at said interface and used for explaining an aspect of the present invention.

FIG. 3 illustrates what is happening with the electric field at the interface 11 between semiconductor layer 2 and a passivating layer 8. It is shown by two different arrows 12, 13 that the electric field changes at the interface, and this change is due to different dielectric constants of the two layers.

The following relation is valid:

$$\epsilon_2 \times E_2 = \epsilon_8 \times E_8$$

This means for the combination of silicon carbide and $SiO_2$, which have a dielectric constant of 10 and 4, respectively, that the electric field in the layer 8 of $SiO_2$ will be 5 MV/cm, i.e. half the critical breakdown field of the best quality $SiO_2$, when the electric field in the SiC-layer is 2 MV/cm (close to the maximum value or SiC). However, for instance AlN has a dielectric constant of 8, so that the electric field therein will be lower at a given electric field in SiC. Accordingly, the nano-crystalline and/or amorphous structure of the protecting layer may form an interface to a semiconductor layer with a low trap density and while preventing build-up of stresses in the semiconductor, even if for the protecting layer a material having a lattice constant differing a lot from that of SiC in the crystalline appearance thereof is selected for the protecting layer. This enables the use of materials (see the list of above) well suited for encapsulating semiconductor devices, multi chip modules and integrated circuits for protecting them and sensors included in said MCM against the influence of severe environmental conditions and protecting electronic equipment close to the device, circuit or module against influences of high electric fields, preventing the occurrence of electric discharges and so on.

FIGS. 4a and 4b illustrates how the valence band 14 and the conduction band 15 will extend from a first semiconductor layer 3 of SiC through a first sub-layer 9 of a material having a larger energy gap between the valence band and the conduction band than SiC and to the second sub-layer 10. The first sub-layer 9 has preferably a thickness of 1 to 15 nm. It is illustrated how such a protecting layer formed by the layers 9 and 10 may take care of charge carriers injected thereinto from the semiconductor layer 3 when an electric field with a considerable magnitude is applied at the interface between the protecting layer and the semiconductor layer. Two idealised scenarios are shown. In FIG. 4a it is shown how a concentration of electrons 16 is formed close to said interface and the electrons may tunnel into the conduction band of the second sub-layer 10. These electrons are subsequently annihilated by recombination (with participation of deep trapping level) or transported away. It is very important that this electrons are not stuck in the protecting layer resulting in severe problems. FIG. 4b shows how electrons may tunnel into trapping levels in the second sub-layer, and they are subsequently transported away by a conduction mechanism called hopping conduction. In both these cases a charge carriers may in the protecting layer, normally substantially in parallel with the interface to the semiconductor layer 3, be transported away to the contacts of the device, which results in a leak current, but this may be kept at a low level if the resistivity of the protecting layer is made high enough.

The invention is of course not in any way restricted to the preferred embodiment described above, but many possibilities to modifications thereof would be apparent to a man with ordinary skill in the art without departing from the basic idea of the invention as defined in the appended claims.

The semiconductor material may for instance be another than SiC, such as Si, for which then the protecting layer according to the invention will function well and be stable within the temperature range characteristic of Si, namely from room temperature up to 250° C.

The different material definitions in this disclosure do of course also include the possibility of doping them and the incorporation of inevitable impurities.

Integral part of the method of formation of passivating layers is the specific choice of process conditions as well as in situ substrate preparation procedures for pre-cleaning and pre-etching all necessary to obtain the best desired effect. The general advantages of the deposition method are low temperature of the process, broad choice of the possible substrates, interface between substrate and deposited layer characterised by low density of imperfections, non-toxical sources of reagents, low cost.

The first material may also be GaAs or SiGe (silicon germanium or germanium doped silicon). The invention is particularly interesting for SiGe as substrate material, since until now no good passivation for that material exists.

What is claimed is:

1. A semiconductor device comprising at least one first semiconductor layer (1–4) and a second layer (8) applied on at least a surface portion of the first layer for protecting the device, said protecting layer being of a second material having a larger energy gap between the valence band and the conduction band than a first material forming said first layer, characterized in that said second material has at least in one portion of said protecting layer a nano-crystalline and amorphous structure by being composed of crystalline grains with a size less than 100 nm and a resistivity at room temperature exceeding $1 \times 10^{10}$ Ωcm.

2. A semiconductor device comprising at least one first semiconductor layer (1–4) and a second layer (8) applied on at least a surface portion of the first layer for protecting the device, said protecting layer being of a second material having a larger energy gap between the valence band and the conduction band than a first material forming said first layer, characterized in that said second material has at least in one portion of said protecting layer a nano-crystalline and/or amorphous structure, whereas nano-crystalline structure is defined as composed of crystalline grains with a size less than 100 nm, and that said second material is one or a combination of any member of the following groups of compounds: AlN, GaN, CN, BN and NCD (Nano-Crystalline Diamond) or metal oxide like any of $Al_2O_3$, $Ta_2O_5$, TiO, $TiO_2$, MgO, $P_2O_5$, $B_2O_3$ or any mixture of these compounds.

3. A semiconductor device according to claim 1, characterized in that said first material is adapted to enable an operation temperature of the semiconductor device of at least 200° C. by being electrically stable at that temperature.

4. A device according to claim 1, characterized in that said first material is SiC.

5. A device according to claim 1, characterized in that said first layer (1–4) has a substantially mono-crystalline structure.

6. A device according to claim 1, characterized in that said protecting layer (8) comprises at least two sub-layers, namely a thin poly-, monocrystalline or amorphous first sub-layer (9) forming an interface to said first semiconductor layer and a much thicker nano-crystalline monocrystalline and/or amorphous second sub-layer (10) on top thereof.

7. A device according to claim 6, characterized characterized in that said first sub-layer is substantially monocrystalline.

8. A device according to claim 6, characterized in that said first sub-layer is substantially polycrystalline.

9. A device according to claim 6, characterized characterised in that said first sub-layer is substantially amorphous.

10. A device according to claim 6, characterized in that said first sub-layer (9) has a thickness of a few atom layers.

11. A device according to claim 6, characterized in that said first sub-layer (9) is $SiO_2$, SiC, AlN, BN, CN, or Diamond.

12. A device according to claim 6, characterized in that said first sub-layer (9) is any of $SiO_2$, SiO, SiN, SiON, or any mixture of these compounds.

13. A device according to claim 6, characterized in that said first sub-layer (9) is a metal oxide like any of $Al_2O_3$, $Ta_2O_5$, $TiO$, $TiO_2$, $MgO$, $P_2O_5$, $B_2O_3$ or any mixture of these compounds.

14. A device according to claim 6, characterized in that said second sub-layer (10) is SiC, AlN, BN, CN, or Diamond.

15. A device according to claim 6, characterized in that said second sub-layer (10) is any of $SiO_2$, SiO, SiN, SiON or any mixture of these compounds.

16. A device according to claim 6, characterized in that said second sub-layer (10) is a metal oxide like any of $Al_2O_3$, $Ta_2O_5$, $TiO$, $TiO_2$, $MgO$, $P_2O_5$, $B_2O_3$ or any mixture of these compounds.

17. A device according to claim 6, characterized in that said first sub-layer (9) has a thickness of 1 to 15 nm.

18. A device according to claim 1, characterized in that the thickness of the protecting layer (8) exceeds 1 $\mu$m.

19. A device according to claim 1, characterized in that the main part of the protecting layer (8) has a nano-crystalline and/or amorphous structure.

20. A device according to claim 1, characterized in that the main part of the protecting layer (8) has a nano-crystalline structure.

21. A device according to claim 1, characterized in that at least a portion of said protecting layer (8) forming an interface (11) to said first semiconductor layer (1–4) has a nano-crystalline structure.

22. A device according to claim 1, characterized in that the main part of the protecting layer (8) has an amorphous structure.

23. A device according to claim 1, characterized in that at least a portion of said protecting layer (8) forming an interference (11) to said first semiconductor layer (1–4) has an amorphous structure.

24. A device according to claim 1, said device having a junction (7) adapted to hold a voltage in a blocking state of the device, characterized in that said protecting layer (8) is adapted to passivate said junction.

25. A device according to claim 19, characterized in that said junction is a pn-junction (7).

26. A device according to claim 1, characterized in that said protecting layer (8) covers all active parts of the device for sealing them with respect to the environment.

27. A device according to claim 19, characterized in that it comprises a Multi Chip Module (MCM) and the protecting layer (8) is adapted to achieve an encapsulating of said module.

28. A device according to claim 1, characterized in that the grain size of the second material in said at least one portion of the second layer (8) is less than 10 nm.

29. A device according to claim 1, characterized in that said first material is Si.

30. A device according to claim 1, characterized in that said first material is GaAs.

31. A device according to claim 1, characterized in that said first material is SiGe.

32. A semiconductor device according to claim 1 which can withstand temperatures up to 900° C. and breakdown fields close to 1–2 MV/cm.

33. A semiconductor device according to claim 1, wherein said second layer (8) is present upon said first layer (1–4) in a final structure of said device.

34. A semiconductor device according to claim 1, comprising four semiconductor layers (1–4) in the following order, a first highly doped layer of P-type (1), a second highly doped layer of P-type (2), a third lightly doped layer of N-type (3), and a fourth highly doped layer of N-type (4), an ohmic metal contact (5) arranged on top of the first layer (1) and an ohmic contact (6) arranged in contact with the fourth layer (4), and said device being encapsulated with said protecting layer (8) covering the entire device except for the contacts (5,6) and passivating a PN-junction (7) between the second and third layers (2,3).

* * * * *